United States Patent [19]
Nacci

[11] 3,885,964
[45] May 27, 1975

[54] PHOTOIMAGING PROCESS USING NITROSO DIMER

[75] Inventor: George Raymond Nacci, Wilmington, Del.

[73] Assignee: E. I. du Pont de Nemours & Company, Wilmington, Del.

[22] Filed: May 31, 1974

[21] Appl. No.: 476,134

[52] U.S. Cl. ...................... 96/35.1; 96/33; 96/36.2; 96/36.3; 96/115 P; 96/115 R; 304/159.18; 304/159.23

[51] Int. Cl. ....... G03c 5/00; G03c 5/03; G03c 5/10

[58] Field of Search ............ 96/35.1, 115 P, 115 R; 304/159.18, 159.23

[56] References Cited

UNITED STATES PATENTS

| | | | |
|---|---|---|---|
| 2,927,022 | 3/1960 | Martin | 96/35 |
| 3,060,023 | 10/1962 | Burg et al. | 96/28 |
| 3,060,026 | 10/1962 | Heiart | 96/28 |
| 3,203,801 | 8/1965 | Heiart | 96/87 |
| 3,625,696 | 12/1971 | Krauch et al. | 96/86 P |

OTHER PUBLICATIONS

Bluhm et al., Nature, 215, pp. 1478–1479 (1967).

*Primary Examiner*—Norman G. Torchin
*Assistant Examiner*—J. P. Brammer

[57] ABSTRACT

Described is a method for producing an image on a substrate by the process which comprises a. coating the substrate with a photopolymerizable composition containing a free-radical polymerizable monomer, an organic polymeric binder, a free-radical initiator, and a thermally dissociable nitroso dimer, b. exposing the coating to radiation through an imagebearing transparency at a temperature of about 50° to 70°C., c. cooling the coating to a temperature below about 45°C. to reduce the concentration of nitroso monomer, d. reexposing a greater portion of the coating to radiation at a temperature below about 45°C., and e. developing the resulting image.

12 Claims, No Drawings

PHOTOIMAGING PROCESS USING NITROSO DIMER

BACKGROUND OF THE INVENTION

1. Field of the Invention

This invention relates to a method for producing images, and especially positive-working, contour images from photopolymerizable films or coatings containing nitroso dimers.

2. Description of the Prior Art

In U.S. application Ser. No. 324,877, filed Jan. 18, 1973, Nacci et al. describe photopolymerizable coating compositions which contain (1) an addition-polymerizable monomer capable of forming a high polymer by free-radical initiated chain addition propagation, (2) from 0 to 97 parts by weight per part of said monomer of a thermoplastic binder having a molecular weight of at least 4,000, (3) from 1.0 to 10% by weight based on total film material of an initiator system based on a 2,4,5-triarylimidazole dimer and a free-radical producing electron donor agent, said initiator system being proportioned to give said film a mean optical density at the initiating wavelengths of from 0.02 to 1; and (4) from 0.1 to 2.0 weight percent of the film material of an inhibitor source consisting of at least one nitroso dimer having a dissociation constant in solution at 25°C. of about $10^{-2}$ to about $10^{-10}$ and a rate of dissociation in solution with a half life comparable to the exposure time of said film.

That invention is based on the fact that nitroso dimers are not free-radical polymerization inhibitors, but dissociate to active inhibiting mononitroso species. Such compounds added to conventional photopolymer compositions thus act as a source of an effective inhibitor for polymerization which extends shelf life and effectively prevents polymerization by thermal initiation. These compositions are used in a single exposure system to give photopolymerized images with greatly improved resolution.

In U.S. application Ser. No. 384,501, filed Aug. 1, 1973, W. J. Nebe describes a two-exposure method of making a positive-working (reverse) image on a substrate by (a) coating the substrate with a photopolymerizable composition containing (1) a nongaseous ethylenically unsaturated compound capable of addition polymerization by free-radical initiated chain propagation; (2) an organic light-sensitive, free-radical generating system; and (3) a photodissociable nitroso dimer, (b) exposing the photopolymerizable coating to light at least some of which has a wavelength of less than 3400A thereby forming nitroso monomer by photodissociation of the nitroso dimer, (c) exposing a greater portion of the coating, including the portion struck by light having a wavelength of less than 3400A, to light substantially limited to wavelengths greater than 3400A, and (d) developing a positive polymeric image by removing the nonpolymerized portion of the polymer coating.

That invention is based on the fact that nitroso dimers are dissociated to active inhibiting mononitroso species by ultraviolet light of wavelength about 2800–3400A. The dimers are relatively unaffected by light of longer wavelength. The nitroso monomer formed by irradiation of nitroso dimer interferes with the normal free-radical induced polymerization process by reaction with free radicals or with photoactivated nitroso monomers to form stable nitroxide radicals which do not propagate a radical chain process. Hence, these nitroxide radicals serve as efficient chain terminators. When exposed to light having a wavelength greater than 3400A, light-sensitive, free-radical initiators absorb light to provide sufficient radicals for polymerization of the monomer except where there is an appreciable concentration of mononitroso species.

The reactions believed to be operable are outlined in equations 1–3, where RNO* represents an excited mononitroso species.

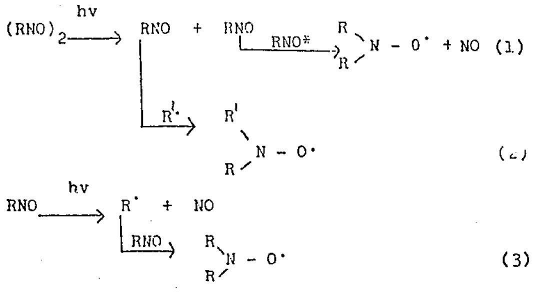

In the context of photohardenable or photopolymerizable systems, a "reverse image" in the photosensitive layer is one in which the areas of the layer corresponding to the dark or opaque areas of the original (e.g., a process transparency) are photohardened while the areas corresponding to the light or transparent areas of the original are not substantially photohardened. A reverse image of this kind provides a "positive-working system". The nonphotohardened material can be removed by means such as solvent wash-out, to leave, as a relief on the substrate, the photohardened material. The resulting substrate with the so-developed layer can be used as either a relief or planographic printing plate to print true copies of the original.

SUMMARY OF THE INVENTION

The present invention relates to a method for producing an image on a substrate by the process which comprises a. coating the substrate with a photopolymerizable composition which comprises
   1. a nongaseous, ethylenically unsaturated compound capable of forming a high polymer by free-radical initiated chain addition propagation,
   2. about 3 to 95% by weight, based on the total composition, of an organic polymeric binder having a molecular weight of at least about 4000,
   3. about 1 to 10% by weight, based on total composition, of an organic, radiation-sensitive, free-radical generating system, and
   4. about 0.1 to 2% by weight, based on the total composition, of a thermally dissociable nitroso dimer having a dissociation constant of about $10^{-2}$ to $10^{-10}$ and a dissociation half-life of at least about 30 seconds in solution at 25°C., the weight ratio of nitroso dimer to free-radical generating system being less than 2 to 1, b. exposing the photopolymerizable coating to radiation having wavelengths essentially limited to about 3400 to 8000A through an image-bearing transparency at a temperature of about 50°–70°C.,
c. allowing the coating to cool to a temperature below about 45°C. to reduce the concentration of nitroso monomer,
d. reexposing a greater portion of the coating, including the portion struck by radiation during the first exposure, to radiation having wavelengths essentially limited to about 3400 to 8000A at a temperature below about 45°C., and
e. developing the resulting image.

DETAILED DESCRIPTION OF THE INVENTION

The present invention is based on the discovery that by raising the temperature of the first exposure to at least about 50°C. using the compositions described in the above described application of Nacci et al., non-imaging, rather than imaging, occurs, and that imaging will occur during a second exposure at a temperature below about 45°C. The term "imaging", as used herein, refers to photopolymerization. In other words, when photopolymerization takes place, imaging occurs.

The process of this invention involves two exposures. During the first imagewise exposure, photopolymerization does not occur. The equilibrium concentration of nitroso monomer at the elevated temperature is sufficient to prevent the chain propagation required for polymerization. During this exposure the free-radicals formed from the initiator by absorption of radiation are consumed by the nitroso monomer.

Between the first and second exposures, the temperature is reduced to below about 45°C. Since nitroso dimer is in thermal equilibrium with monomer, $$(RNO)_2 \overset{\Delta}{\rightleftharpoons} 2RNO$$

a decrease in temperature of the photopolymerization system shifts the equilibrium thereby decreasing the relative concentration of nitroso monomer molecules present. Hence, during the second exposure at a lower temperature, the concentration of nitroso monomer is insufficient to prevent radical chain propagation of monomer molecules and imaging occurs in the areas radiation-struck in the second exposure but not struck during the first exposure.

The photopolymerizable compositions used in accordance with this invention must contain (1) a free-radical polymerizable compound, (2) an organic polymeric binder, (3) an organic, radiation-sensitive, free-radical generating system, and (4) a thermally dissociable nitroso dimer. Suitable polymerizable compounds are the nongaseous, ethylenically unsaturated compounds capable of addition polymerization by free-radical initiated chain propagation described by Burg et al. in U.S. Pat. No. 3,060,023; by Martin et al. in U.S. Pat. No. 2,927,022; and in the coassigned patent application of Hertler, Ser. No. 299,471, filed Oct. 20, 1972. In addition, the polymerizable, ethlenically unsaturated polymers described by Burg in U.S. Pat. No. 3,043,805 and by Martin in U.s. Pat. No. 2,929,710 and similar materials may be used alone or mixed with other materials. The photocrosslinkable polymers disclosed by Schoenthaler in U.s. Pat. No. 3,418,295, and by Celeste in U.S. Pat. No. 3,448,089 may also be used. The amount of monomer added varies with the particular polymer used.

The preferred compounds are those having a plurality of addition polymerizable, ethylenic linkages, particularly when present as terminal linkages, and especially those wherein at least one, and preferably most, of such linkages are conjugated with a doubly bonded carbon, including carbon doubly bonded to carbon and to such heteroatoms as nitrogen, oxygen and sulfur. Outstanding are such materials wherein the ethylenically unsaturated groups, especially the vinylidene groups, are conjugated with ester or amide structures, for example compounds such as an alkylene or polyalkylene polyol triacrylate.

Suitable unsaturated compounds include unsaturated esters of alcohols, preferably polyols and particularly such esters of α-methylenecarboxylic acids, for example, ethylene glycol diacrylate, diethylene glycol diacrylate, glycerol diacrylate, glycerol triacrylate, mannitol polyacrylate, sorbitol polyacrylates, ethylene glycol dimethacrylate, 1,3-propanediol dimethacrylate, 1,2,4-butanetriol trimethacrylate, trimethylolpropane triacrylate, triethylene glycol diacrylate, 1,4-cyclohexanediol diacrylate, 1,4-benzenediol dimethacrylate, pentaerythritol di-, tri-, and tetramethacrylate, dipentaerythritol polyacrylate, pentaerythritol di-, tri-, and tetraacrylates, 1,3-propanediol diacrylate, 1,5-pentanediol dimethacrylate, p-α,α-dimethylbenzenephenyl acrylate, the bis-acrylates and methacrylates of polyethylene glycols of molecular weight 200–4000, and the like; unsaturated amides, particularly those of α-methylenecarboxylic acids, and especially those of α,ω-diamines and oxygen-interrupted α,ω-diamines, such as methylene bis-acrylamide, methylene bis-methacrylamide, ethylene bis-methacrylamide, 1,6-hexamethylene bis-acrylamide, diethylene triamine tris-methacrylamide, bis-(γ-methacrylamidopropoxy)ethane, β-methacrylamidoethyl methacrylate, N-(β-hydroxyethyl)-β-(methacrylamido) ethyl acrylate, and N,N-bis(β-methacryloxyethyl) acrylamide; vinyl esters such as divinyl succinate, divinyl adipate, divinyl phthalate, divinyl terephthalate, divinyl benzene-1,3-disulfonate, and divinyl butane-1,4-disulfonate; styrene and derivatives thereof; and unsaturated aldehydes, such as sorbaldehyde (hexanedienal).

The photopolymerizable compositions of this invention must also contain an organic polymer binder having a molecular weight of at least about 4000. The word "organic", as used throughout the specification and claims, designates compounds which contain carbon, and one or more of oxygen, hydrogen, nitrogen, sulfur and halogen, but are free of metal. The binders are normally employed in concentrations of about 3–95% by weight, based on the total composition, and preferably about 25–75%.

Suitable polymer binders include:

A. Copolyesters, e.g., (a) those prepared from the reaction product of a polymethylene glycol of the formula $HO(CH_2)_nOH$, wherein $n$ is a whole number 2–10, inclusive, and (1) hexahydroterephthalic, sebacic and terephthalic acids, (2) terephthalic, isophthalic sebacic acids, (3) terephthalic and sebacic acids, or (4) terephthalic and isophthalic acids, and (b) mixtures of copolyesters prepared from said glycols and (i) terephthalic, isophthalic and sebacic acids, and (ii) terephthalic, isophthalic, sebacic and adipic acids:

B. Nylons or polyamides, e.g., N-methoxymethyl polyhexamethylene adipamide;

C. Vinylidene chloride copolymers, e.g., vinylidene chloride/acrylonitrile, vinylidene chloride/methyl methacrylate, and vinylidene chloride/vinyl acetate copolymers;

D. Ethylene/vinyl acetate copolymers;

E. Cellulosic ethers, e.g., methyl cellulose, ethyl cellulose and benzyl cellulose;

F. Polyethylene;

G. Synthetic rubbers, e.g., butadiene/acrylonitrile copolymers, and chloro-2-butadiene-1,3-polymers;

H. Cellulose esters, e.g., cellulose acetate, cellulose acetate succinate and cellulose acetate butyrate;

I. Polyvinyl esters, e.g., polyvinyl acetate/acrylate, polyvinyl acetate/methacrylate, and polyvinyl acetate;

J. Polyacrylate and α-alkyl polyacrylate esters, e.g., polymethyl methacrylate, polyethyl methacrylate, polymethyl methacrylate/acrylic acid, and polymethyl methacrylate/methacrylic acid;

K. High molecular weight polyethylene oxides of polyglycols having average molecular weights from about 4000 to 1,000,000;

L. Polyvinyl chloride and copolymers, e.g., polyvinyl chloride/acetate;

M. Polyvinyl acetal, e.g., polyvinyl butyral, and polyvinyl formal;

N. Polyformaldehyde;

O. Polyurethanes;

P. Polycarbonates; and

Q. Polystyrenes.

A preferred group of binders include the polyacrylates and α-alkylacrylate esters, particularly polymethyl methacrylate.

Although thermoplastic binders are normally and preferably employed, there can be added in addition to or instead of said binders, nonthermoplastic polymeric compounds to improve certain desirable characteristics, e.g., adhesion to the base support, adhesion to the image-receptive support on transfer, wear properties, chemical inertness, etc. Suitable nonthermoplastic polymeric compounds include polyvinyl alcohol, cellulose, anhydrous gelatin, phenolic resins, melamineformaldehyde resins, and the like. If desired, the photopolymerizable layers can also contain immiscible polymeric or nonpolymeric organic or inorganic fillers or reinforcing agents which are essentially transparent at the wavelengths used for the exposure of the photopolymerizable materials, e.g., the organophilic silicas, bentonites, silica, powdered glass, colloidal carbon, as well as various types of dyes and pigments. Such materials are used in amounts varying with the desired properties of the photopolymerizable layer. The fillers are useful in improving the strength of the compositions, reducing tack and, in addition, as coloring agents.

When the polymer is a hard, high-melting compound, a plasticizer is usually used to lower the glass transition temperature and facilitate selective stripping. The plasticizer may be any of the common plasticizers compatible with the polymeric binder. Among the common plasticizers are dialkyl phthalates, alkyl phosphates, polyethylene glycol and polyethylene glycol esters. The particular nature of the monomer/binder system is not critical to this invention.

The third component which the photopolymerizable coating composition must contain is an organic, radiation-sensitive, free-radical generating system which initiates polymerization of the monomer and does not subsequently terminate the polymerization. The free-radical generating system should have at least one component that has an active radiation absorption band with a molar extinction coefficient of at least about 50 within the range of about 3400 to 8000A, and preferably about 3400 to 5000A. "Active radiation absorption band" means a band of radiation which is active to produce the free radicals necessary to initiate polymerization of the monomeric material. The free-radical generating system can comprise one or more compounds which directly furnish free radicals when activated by radiation. It can also comprise a plurality of compounds, one of which yields free radicals after having been caused to do so by a sensitizer which is activated by the radiation.

A large number of such compounds can be utilized in the practice of this invention including aromatic ketones such as benzophenone, Michler's ketone (4,4'-bis-(dimethylamino)benzophenone), 4,4'-bis (diethylamino) benzopenone, 4-acryloxy-4'-dimethylaminobenzophenone, 4-acryloxy-4'-diethylaminobenzophenone, 4-methoxy-4'-dimethylaminobenzophenone, 2-ethylanthraquinone, phenanthraquinone, benzoin, benzoin ethers such as benzoin methyl ether, benzoin ethyl ether and benzoin phenyl ether, methylbenzoin, ethylbenzoin and other aromatic ketones; and 2,4,5-triarylimidazole dimers such as 2-(o-chlorophenyl)-4,5-diphenylimidazole dimer, 2-(o-chlorophenyl)-4,5-di-m-methoxyphenyl)imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di-(p-methoxyphenyl)-5-phenylimidazole dimer, 2-(2,4-dimethoxyphenyl)-4,5-diphenylimidazole dimer, 2-(p-methylmercaptophenyl)-4,5-diphenylimidazole dimer, and the like disclosed in U.S. Pat. Nos. 3,479,185 and 3,784,557 and in British Pat. Nos. 997,396, published July 7, 1965, and 1,047,569, published Nov. 9, 1966.

The preferred initiators are the 2,4,5-triarylimidazole dimers. These are used with a free-radical producing electron donor agent, such as 2-mercaptobenzoxazole, leuco crystal violet or tris(4-diethylamino-2-methylphenyl)-methane, which is preferred. Such sensitizers as Michler's ketone may be added. Various energy transfer dyes such as Rose Bengal and Eosin Y can also be used. Additional examples of suitable initiators are disclosed by Plambeck in U.S. Pat. No. 2,760,863. The preferred initiating systems employ a triarylimidazole dimer and a free-radical producing electron donor agent, with or without the use of a sensitizing compound as described in U.S. Pat. No. 3,479,185 to Chambers. The concentration of the free-radical generating system employed should be about 1 to 10% by weight based on total composition, and preferably about 1 to 8% by weight.

The fourth component which is essential to the photopolymerizable composition is a nitroso dimer having a dissociation constant of about $10^{-2}$ to $10^{-10}$ and a dissociation half-life of at least about 30 seconds in solution at 25°C. The preferred nitroso compounds in the monomeric form have at least one nitroso group attached to a primary or secondary carbon atom, although certain nitroso compounds wherein the nitroso group is attached to an activated tertiary carbon atom are useful. Compounds containing two or more nitroso groups wherein the association of the nitroso groups is intramolecular rather than intermolecular can also be employed provided the above conditions with respect to dissociation constant and rate of dissociation are fulfilled.

Examples of nitroso compounds, the formulas of which are written for convenience in the monomeric form except where the association is intramolecular, include:

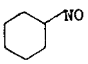

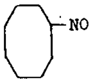

NO
|
CH3CHCO2C2H5 n-C3H7CH(NO)C3H7

C2H5CHCO2C2H5
|
NO (CH3)2CHNO n-C4H9CH(NO)CO2C2H5

CH3CH(NO)C2H5

(CH3)2CHCH2CH2CH(NO)CO2C2H5

C2H5O2CCH2CH(NO)CO2C2H5

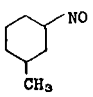

CH3COCH(CO2C2H5)CH(NO)CO2C2H5

(CH3)2CHCH(NO)CH3

CH3COCH(NO)COC6H5

C6H5COCH(NO)COC6H5 p-CH3OC6H4COCH(NO)COC6H5

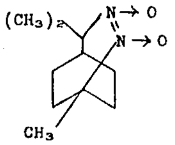

CH3
|
NC - C - NO
|
CH3

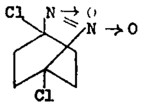

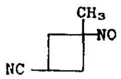

CH3CO2CH-CH(NO)CH3

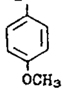

CH3CO2CHCH(NO)CH3

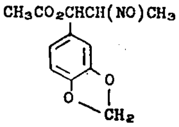

CH3CO2CHCH(NO)CH3

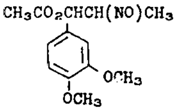

CH3CO2CHCH(NO)CH3

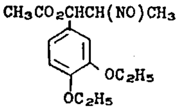

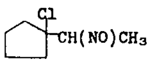

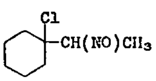

n-C4H9CH(NO)CH2CH2CH2OH

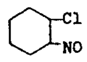

n-C6H13CH(NO)CH3

CH3CH(NO)Cl

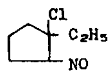

HO(CH2)6NO (CH3)3CCH2CH(NO)C(CH3)2ONO2

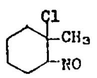

CH3CH(Cl)CH(NO)CH3

CH3CH(Cl)CH(NO)C2H5

C6H5CH(Cl)CH(NO)CH3

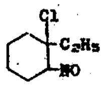

(CH3)2C(Cl)CH(NO)CH3

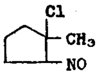

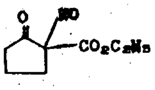

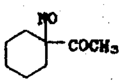

(CH3)2CHCOC(CH3)(NO)CH3

C2H5COC(CH3)(NO)CH3

CH3COC(CH3)(NO)CH3

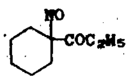

(CH3)2CHCH2COC(CH3)(NO)CH3

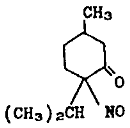

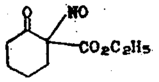

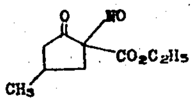

C6H5COC(CH3)(NO)CO2C2H5

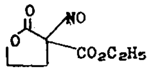

[(CH3)3C]2CHNO

CH3C(CH(CH3)2)2CH2NO

CH3NO

CH3(CH2)16CH2NO

CH3(CH2)10CH2NO

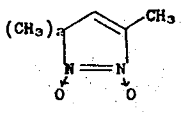

The nitroso dimers are ordinarily employed in concentrations of about 0.1 to 2 weight percent based on the total composition. The preferred amount in any specific case will depend upon the particular monomer/initiator system employed and the amount and kind of free-radical generating system present. In general, the preferred amount of nitroso dimer will be about 0.15 to 1.5 percent by weight based on the total composition. The weight ratio of nitroso dimer to free-radical generating system should be less than 2:1. Preferably the weight ratio is in the range of about 0.1:1 to 1.75:1.

The photopolymerizable compositions described herein may be coated on a wide variety of natural and synthetic substrates. By "substrate" is meant any flexible or rigid support which is capable of existing in film or sheet form. For example, the substrate could be a metal sheet or foil, a sheet or film of synthetic organic resin, cellulose paper, fiberboard, and the like, or a composite of two or more of these materials. Specific substrates include copper, alumina-blasted aluminum, alumina-blasted Mylar polyester film, Mylar polyester film, polyvinyl alcohol-coated paper, cross-linked polyester-coated paper, nylon, polypropylene, glass, heavy paper such as lithographic paper, and the like. A copper base is preferred.

The particular substrate will generally be determined by the use application involved. When the photopolymerizable compositions are coated on metal surfaces, they may be useful for making presensitized lithographic and gravure printing plates. For example, use of a grained aluminum base in combination with a photopolymerizable coating results in a developed lithographic plate. The plate is first coated with water and is then contacted with a roller which wets only the photopolymer image with ink. The inked plate can then be used in a lithographic printing step in the usual way.

In addition to the preparation of gravure printing plates, the coated compositions can serve as photoresists in making etched or plated circuits or in chemical milling applications. They are also useful for preparing colored images from color separation negatives suitable for color-proofing. The images formed with these elements may also be used for making copies by thermal transfer to a substrate. Specific uses will be evident to those skilled in the art; many uses are disclosed in U.S. Pat. Nos. 2,760,863; 3,060,023; 3,060,026 and 3,469,982.

Processes for coating the substrate are described in the patents listed in the preceeding paragraph. In a preferred coating process the components of the photopolymerizable composition are dissolved together in a solvent in which the components are preferably completely soluble and the resulting solution is poured or painted onto the substrate. Preferred solvents include chlorinated hydrocarbons, especially methylene chloride.

The first exposure to radiation is an imagewise exposure at a temperature of about 50°to 70°C. through a transparency bearing the desired image. Radiation from any source can be used provided it has wavelengths essentially limited to about 3400 to 8000A. For all practical purposes, this limitation on the wavelength of the radiation does not require any special equipment since radiation which passes through normal glass is generally limited to wavelengths of about 3400 to 8000A. By "essentially limited to 3400 to 8000A" it is meant that any wavelengths below about 3400 are present in such minor amounts that they do not materially affect the desired result.

At a temperature of the first exposure to radiation the nitroso dimer-monomer equilibrium will provide sufficient nitroso monomer to prevent imaging. During this first exposure free-radicals are consumed by reaction with nitroso monomer in the radiation-struck areas. Preferably this first exposure is carried out at a temperature of about 55°to 65°C.

After this first exposure, the nitroso monomer concentration is reduced by allowing the system to cool to a temperature below about 45°C. The second exposure at that lower temperature is an overall exposure to radiation having wavelengths essentially limited to about 3400 to 8000A since shorter wavelengths will shift the nitroso dimer-monomer equilibrium. During the second exposure photopolymerization can take place uninhibited by nitroso monomer. The temperature during the second exposure can be as low as about 0°C. or lower. Preferably the second exposure is carried out at room temperature. The actual temperature employed for the second exposure is determined by the dissociation constant of the nitroso dimer employed and by the initiator system, its concentration, and its efficiency.

Suitable sources of radiation, in addition to sunlight, include carbon arcs, mercury-vapor arcs, fluorescent lamps with ultraviolet radiation-emitting phosphors, argon glow lamps, electronic flash units and photographic-flood lamps. Other fluorescent radiation sources such as the tracings on the face of a cathode ray tube may be used. Electron accelerators and electron beam source through an appropriate mask may also be used.

Where artificial radiation sources are used, the distance between the photosensitive layer and the radiation source may be varied according to the radiation sensitivity of the composition and the nature of the photopolymerizable polymer. Customarily, mercury-vapor arcs are used at a distance of about 1.5 to 20 inches from the photopolymerizable layer. Radiation fluxes of about 20–2000 $\mu w/cm^2$ are generally suitable for use.

The length of time for which the compositions are exposed to radiation may vary upwards from about a few seconds. The exposure times will vary, in part, according to the nature and the concentration of the polymerizable compound and initiator, and the type of radiation.

The exposed photosensitive layer may be developed into positive-working contour images by removing the unpolymerized ethylenically unsaturated compound from the coating and leaving behind only the polymeric replica of the original. This may be accomplished by solvent washout, thermal transfer, pressure transfer, differential adhesion of the exposed versus unexposed areas, heating under conditions such that some or all of the volatile components are vaporized leaving behind the photopolymer, and so forth. The conditions of thermal development selected will depend upon the nature of the substrate, the volatility of the components to be removed, and the thermal stability of the components. A preferred method of removing the unpolymerized material is to employ a suitable solvent applied by an air spray. The use of an air spray rather than the conventional method of spraying liquid solvents enables advantage to be taken of the high relief achieved with the films of photopolymers of the present invention. Negative-working images may be produced by dusting or toning the exposed coating with dyes or pigments that adhere to the tacky unpolymerized areas, but not to the photohardened areas.

EXAMPLES OF THE INVENTION

The following examples, illustrating the novel photoimaging methods of this invention, are given without any intention that the invention be limited thereto.

In these examples, the coating solutions were prepared by dissolving the reactants in methylene chloride at 25°C. The solutions were coated with a doctor knife onto "1 oz." copper-clad circuit board, 100 mils thick. The copper surfaces of the boards were cleaned with pumice powder and water just before coating with the photopolymer solutions. The coatings were dried at 25°C. and those coatings so identified were coated with a 1% by weight polyvinyl alcohol solution (Elvanol 51-05) in water using a cotton ball dampened with the polymer solution. Coating thicknesses (dried) of these topcoats were 0.05 mil or less.

Samples were exposed in a glass vacuum frame (nuArc Co.) at 1 mm pressure or under nitrogen at atmospheric pressure to a medium pressure mercury resonance lamp (100 W $AH_4$) held 4 inches away from the sample, except as noted. The system was evacuated for 2 minutes prior to exposure and during the exposure. Itek Corp. silver image film transparencies of a 1951 Air Force test pattern were used with the emulsion side of the patterns in contact with the photopolymerizable coatings. After the exposures, the samples were washed with cold water to remove the polyvinyl alcohol coatings and then spray-developed (unless otherwise noted) using methyl chloroform in a spray gun held two inches from the samples. The developed samples were examined optically.

EXAMPLE 1

A stock solution of a mixture of 2.90 g of trimethylolpropane triacrylate containing 245 ppm hydroquinone inhibitor, 0.88 g of conventional plasticizers, 0.44 g of triethylene glycol diacetate, 5.24 g of polymethyl methacrylate resin, 0.40 g of 2-o-chlorophenyl-4,5-diphenylimidazole dimer, 0.03 g of tris(4-diethylamino-2-methylphenyl)methane, 0.02 g of an adhesion promoter, and 0.01 g of Michler's ketone dissolved in 40 ml of methylene chloride was prepared. To one-eighth of this solution was added 0.015 g of nitrosocyclohexane dimer and the resulting solution coated onto a copper-clad circuit board. The solvent was evaporated at 25°C. to leave a coating 2 mils thick. The plate was exposed through a line negative under a nitrogen atmosphere, as described, at 50°C. for 0.5 minute. The exposed plate was cooled to 25°C. and reexposed, without the negative, for 0.5 minute. After development as described, a positive image was obtained.

A similar experiment in which the exposure temperatures were 60°C. and 25°C gave essentially similar results.

In another experiment the nitrosocyclohexane dimer was replaced with di-t-butylnitrosomethane dimer and the first exposure was carried out through a line negative at 50°C. for 4 minutes, followed by reexposure without the negative at 0°C. for 2 minutes. After development as described, a positive image was obtained which was developed down to the base of the copper plate.

EXAMPLE 2

A stock solution of a mixture of 5.2 g of a polymethyl methacrylate/acrylic acid resin, 3.7 g of trimethylolpropane triacrylate, 0.7 g of conventional plasticizer and 0.01 g of adhesion promoter was dissolved in 40 ml of methylene chloride which contained 6% by volume of methanol. To one-half of this solution was added 0.05 g of benzophenone and 0.005 g of Michler's ketone. To one-quarter of the resulting solution was added 0.015 g of nitrosocyclohexane dimer and the resulting solution coated onto a copper-clad circuit board. The solvent was evaporated at 25°C. to leave a 2.0 mil dried coating. The plate was exposed through a line negative under nitrogen, as described, at 60°C. for 5 minutes. The exposed plate was cooled to 0°C. and reexposed, without the negative, for 15 minutes. After development as described, a positive image was obtained.

EXAMPLE 3

A stock solution of a mixture of 2.90 g of trimethylolpropane triacrylate, 0.88 g of conventional plasticizers, 0.44 g of triethylene glycol diacetate, 5.24 g of polymethyl methacrylate resin, and 0.02 g of an adhesion promoter dissolved in 40 ml of methylene chloride was prepared. To one-half of this solution was added 0.05 g of benzoin methyl ether photoinitiator. To one-quarter of the resulting solution was added 0.015 g of nitrosocyclohexane dimer and the solution coated as described in Example 2. The plate was exposed at 60°C. for 20 minutes through a line negative, cooled to 0°C. and reexposed at 0°C. for 10 minutes as described in Example 2. A positive image was obtained

EXAMPLE 4

A stock solution of a mixture of 11.60 g of trimethylolpropane triacrylate, 3.52 g of conventional plasticizers, 1.76 g of triethylene glycol diacetate, 10.96 g of polymethyl methacrylate resin, 0.40 g of 2-o-chlorophenyl-4,5-diphenylimidazole dimer, 0.002 g of Michler's ketone and 0.08 g of adhesion promoter dissolved in 160 ml of methylene chloride was prepared. To one-half of this solution was added 0.006 g of tris(4-diethylamino-2-methylphenyl)methane. To one-third of the resulting solution was added 0.050 g of di-t-butylnitrosomethane dimer and the resulting solution coated onto a copper-clad circuit board to give a final coating 15 mils thick. The plate was exposed through a line negative as described in Example 2 at 60°C. for 8–16 minutes. The exposed plate was cooled to 0°C. and reexposed for 8–16 minutes without the negative to give a positive image after development.

EXAMPLE 5

The stock solution of Example 4 was prepared except that the Michler's ketone was replaced with 2-o-chlorophenyl-4,5-diphenylimidazole dimer. To one-half of this solution was added 0.006 g of tris(4-diethylamino-2-methylphenyl)methane. To one-eighth of this solution was added 0.02 g of 6-hydroxy-1-nitrosohexane dimer nd the resulting solution coated onto a copper-clad circuit board to give a final coating 2 mils thick. The plate was exposed through a line negative as described in Example 2 at 60°C. for 2–16 minutes. The exposed plate was cooled to 0°C. and reexposed for 8 minutes without the negative to give a positive image after development.

Although the invention has been described and exemplified by way of specific embodiments, it is not intended that it be limited thereto. As will be apparent to those skilled in the art, numerous modifications and variations of these embodiments can be made without departing from the spirit of the invention or the scope of the following claims.

The embodiments of the invention in which an exclusive property or privilege is claimed are defined as follows:

1. A method for producing an image on a substrate by the process which comprises
   a. coating the substrate with a photopolymerizable composition which comprises
      1. a nongaseous, ethylenically unsaturated compound capable of forming a high polymer by free-radical initiated chain addition propagation,
      2. 3 to 95% by weight, based on the total composition, of an organic polymeric binder having a molecular weight of at least 4000,
      3. 1 to 10% by weight, based on the total composition, of an organic, radiation-sensitive, free-radical generating system, and 4. 0.1 to 2% by weight, based on the total composition, of a thermally dissociable nitroso dimer having a dissociation constant of $10^{-2}$ to $10^{-10}$ and a dissociation half-life of at leat 30 seconds in solution at 25°C., the weight ratio of nitroso dimer to free-radical generating system being less than 2 to 1, b. exposing the photopolymerizable coating to radiation having wavelengths essentially limited to 3400 to 8000A through an image-bearing transparency at a temperature of 50°–70°C., c. allowing the coating to cool to a temperature below 45°C. to reduce the concentration of nitroso monomer, d. reexposing a greater portion of the coating, including the portion struck by radiation during the first exposure, to radiation having wavelengths essentially limited to 3400 to 8000A at a temperature below 45°C., and e. developing the resulting image.

2. The method of claim 1 in which the unsaturated compound contains a plurality of terminal addition polymerizable ethylenic linkages wherein at least one such linkage is conjugated with a double bonded carbon.

3. The method of claim 2 in which the unsaturated compound is an acrylic ester.

4. The method of claim 3 in which the unsaturated compound is trimethylolpropane triacrylate.

5. The method of claim 1 in which the free-radical generating system is 1 to 8% by weight, based on the total composition, of a 2,4,5-triarylimidazole dimer and a free-radical producing electron donor agent.

6. The method of claim 5 in which the free-radical generating system is 2-o-chlorophenyl-4,5-diphenylimidazole dimer and tris(4-diethylamino-2-methylphenyl)-methane.

7. The method of claim 1 in which the photopolymerizable composition contains 0.15 to 1.5% by weight, based on the total composition, of nitrosocyclohexane dimer.

8. The method of claim 1 in which the photopolymerizable composition contains 25 to 75% by weight, based on the total composition, of polymethyl methacrylate resin.

9. The method of claim 1 in which a positive-working contour image is developed by removing the nonpolymerized portion of the coating.

10. The method of claim 1 in which the weight ratio of nitroso dimer to free-radical generating system is in the range of 0.1:1 to 1.75:1.

11. The method of claim 1 in which the second exposure is at room temperature.

12. The method of claim 1 in which the unsaturated compound is trimethylolpropane triacrylate, the free-radical generating system is 1 to 8% by weight, based on the total composition, of 2-o-chlorophenyl-4,5-diphenylimidazole dimer and tris(4-diethylamino-2-methylphenyl)methane, the nitroso dimer is 0.15 to 1.5% by weight, based on the total composition, of nitrosocyclohexane dimer, and the polymeric binder is 25 to 75% by weight, based on the total composition, of polymethyl methacrylate resin.

* * * * *

UNITED STATES PATENT OFFICE

CERTIFICATE OF CORRECTION

PATENT NO. : 3,885,964

DATED : May 27, 1975

INVENTOR(S) : George Raymond Nacci

It is certified that error appears in the above-identified patent and that said Letters Patent are hereby corrected as shown below:

Column 3, line 61, "U.s." should read --U.S.--.

Column 3, line 64, "U.s." should read --U.S.--.

Column 4, line 61, "phthalic sebacic" should read --phthalic and sebacic--.

Column 6, line 28, "4,5-di-m-" should read --4,5-di(m- --.

Column 12, line 16, "10.96" should read --20.96--.

Column 12, line 39, "nd" should read --and--.

Column 13, line 4, "leat" should read --least--.

Signed and Sealed this

*thirtieth* Day of *September 1975*

[SEAL]

*Attest:*

RUTH C. MASON
*Attesting Officer*

C. MARSHALL DANN
*Commissioner of Patents and Trademarks*